(12) United States Patent
Chae

(10) Patent No.: US 10,624,239 B1
(45) Date of Patent: Apr. 14, 2020

(54) ANALOG DIGITAL CONVERTER, AND COMMUNICATION TERMINAL INCLUDING THE SAME

(71) Applicant: KOOKMIN UNIVERSITY INDUSTRY-ACADEMIC COOPERATION FOUNDATION, Seoul (KR)

(72) Inventor: Hyung Il Chae, Seoul (KR)

(73) Assignee: KOOKMIN UNIVERSITY INDUSTRY-ACADEMIC COOPERATION FOUNDATION, Seoul (KR)

( * ) Notice: Subject to any disclaimer, the term of this patent is extended or adjusted under 35 U.S.C. 154(b) by 0 days.

(21) Appl. No.: 16/442,663

(22) Filed: Jun. 17, 2019

(30) Foreign Application Priority Data

Apr. 17, 2019 (KR) .......................... 10-2019-0045077

(51) Int. Cl.
| | |
|---|---|
| *H03M 1/46* | (2006.01) |
| *H03M 1/40* | (2006.01) |
| *H05K 7/20* | (2006.01) |
| *H05K 1/02* | (2006.01) |
| *G03B 17/55* | (2006.01) |

(52) U.S. Cl.
CPC ............ *H05K 7/2039* (2013.01); *G03B 17/55* (2013.01); *H03M 1/40* (2013.01); *H03M 1/46* (2013.01); *H03M 1/462* (2013.01); *H05K 1/028* (2013.01)

(58) Field of Classification Search
CPC ............ H03M 1/40; H03M 1/46; H03M 1/462
USPC .................................................. 341/163, 172
See application file for complete search history.

(56) References Cited

U.S. PATENT DOCUMENTS

| | | | | |
|---|---|---|---|---|
| 8,319,527 B1 * | 11/2012 | Kaplan | ............... | H03M 1/1245 327/91 |
| 8,723,708 B2 * | 5/2014 | Lee | ..................... | H03M 1/1245 341/120 |

* cited by examiner

*Primary Examiner* — Khai M Nguyen
(74) *Attorney, Agent, or Firm* — Sughrue Mion, PLLC

(57) ABSTRACT

An analog-to-digital converter includes an adder configured to add an input signal and a feedback signal generated based on the input signal and output an output signal as the result, a successive approximation register analog-to-digital converter (SAR ADC) configured to output a differential signal corresponding to a difference between a digital output signal obtained by quantizing the output signal output from the adder and the input signal, and a bandpass filter circuit configured to perform bandpass filtering on the differential signal output from the SAR ADC and to output the feedback signal according to a result of the bandpass filtering.

13 Claims, 3 Drawing Sheets

ANALOG DIGITAL CONVERTER, AND COMMUNICATION TERMINAL INCLUDING THE SAME

BACKGROUND

1. Field

The present invention relates to an analog-to-digital converter and a communication terminal including the same, and more particularly, to an analog-to-digital converter capable of generating a feedback signal through bandpass filtering in a feedback path while facilitating operation of the feedback signal by applying a successive approximation register analog-to-digital converter (SAR ADC) to a structure capable of analog-to-digital conversion by adding an input signal and the feedback signal, and a communication terminal including the analog-to-digital converter.

2. Description of the Related Art

When receiving an RF signal from a general communication terminal, the communication terminal may include components such as an antenna, a low noise amplifier, a filter, a mixer, a filter, an amplifier, and an analog-to-digital converter for processing the received RF signal.

A clock signal needs to be generated to operate the mixer among the components of the communication terminal, and the clock signal may be generated through a phase locked loop (PLL).

However, since a plurality of PLLs are required for a receiver in a communication terminal supporting various frequencies, there is a problem that resources and power consumption are rapidly increased.

SUMMARY

The present invention is directed to an analog-to-digital converter capable of generating a feedback signal through bandpass filtering in a feedback path while facilitating operation of the feedback signal by applying a successive approximation register analog-to-digital converter (SAR ADC) to a structure capable of analog-to-digital conversion by adding an input signal and the feedback signal, and a communication terminal including the analog-to-digital converter.

Additional aspects will be set forth in part in the description which follows and, in part, will be apparent from the description, or may be learned by practice of the presented embodiments.

According to an aspect of the present invention, an analog-to-digital converter includes an adder configured to add an input signal and a feedback signal generated based on the input signal and output an output signal as the result; a successive approximation register analog-to-digital converter (SAR ADC) configured to output a differential signal corresponding to a difference between a digital output signal obtained by quantizing the output signal output from the adder and the input signal; and a bandpass filter circuit configured to perform bandpass filtering on the differential signal output from the SAR ADC and to output the feedback signal according to a result of the bandpass filtering In some embodiments, the SAR ADC comprises a quantizer configured to quantize the output signal output from the adder and output the digital output signal In some embodiments, the SAR ADC comprises a capacitor module comprising at least one capacitor for storing the digital output signal output from the quantizer.

In some embodiments, the capacitor module is configured to output the differential signal corresponding to the difference between the digital output signal stored in the at least one capacitor and the input signal.

In some embodiments, the bandpass filter circuit is configured to form a signal path in which first circuit components corresponding to a denominator of a transfer function of the bandpass filter circuit and second circuit components corresponding to a molecule of the transfer function are separated from each other.

In some embodiments, the first circuit components are configured to form signal paths that are separated from one another for each denominator term of the transfer function, In some embodiments, the second circuit components are configured to form signal paths that are separated from one another for each molecule term of the transfer function.

In some embodiments, the first circuit components and the second circuit components comprise at least one of an amplifier and a delay.

In some embodiments, the bandpass filter circuit further comprises: a switch circuit for generating the feedback signal based on outputs of the first circuit components and the second circuit components.

In some embodiments, an output signal of the switch circuit is fed back and input to an input terminal of the signal path constituted by the first circuit components.

According to an aspect of the present invention, a communication terminal comprises an antenna configured to receive an RF signal; and an analog-to-digital converter configured to analog-to-digital convert the received RF signal, wherein the analog-to-digital converter comprises an adder configured to add an input signal and a feedback signal generated based on the input signal and output an output signal as the result; a successive approximation register analog-to-digital converter (SAR ADC) configured to output a differential signal corresponding to a difference between a digital output signal obtained by quantizing the output signal output from the adder and the input signal; and a bandpass filter circuit configured to perform bandpass filtering on the differential signal output from the SAR ADC and to output the feedback signal according to a result of the bandpass filtering.

In some embodiments, the communication terminal further comprises a low noise amplifier configured to low noise amplify the received RF signal and input the low noise amplified RF signal to the analog-to-digital converter.

In some embodiments, the communication terminal further comprises a digital filter configured to filter only a frequency band set in the digital output signal output from the analog-to-digital converter and to output the filtered signal.

BRIEF DESCRIPTION OF THE DRAWINGS

A brief description of each drawing is provided to more fully understand drawings recited in the detailed description of the present invention.

DETAILED DESCRIPTION

Figure 1:
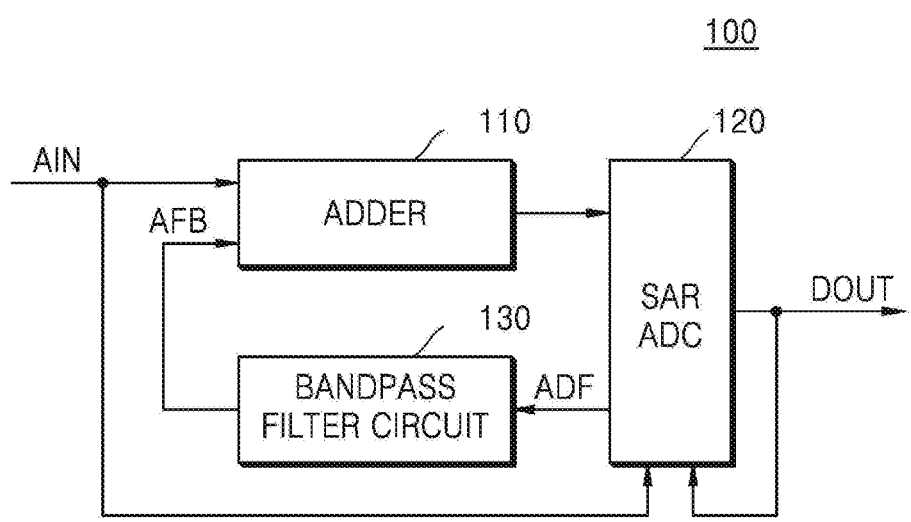
FIG. 1 is a block diagram of an analog-to-digital converter according to an embodiment of the present invention.

The inventive concept may be variously modified and have various example embodiments, so that specific example embodiments will be illustrated in the drawings and described in the detailed description. However, this does not limit the inventive concept to specific example embodiments, and it should be understood that the inventive concept covers all the modifications, equivalents and replacements included within the idea and technical scope of the inventive concept.

In describing the inventive concept, in the following description, a detailed explanation of known related technologies may be omitted to avoid unnecessarily obscuring the subject matter of the inventive concept. In addition, numeral figures (for example, 1, 2, and the like) used during describing the specification are just identification symbols for distinguishing one element from another element.

Further, in the specification, if it is described that one component is "connected" or "accesses" the other component, it is understood that the one component may be directly connected to or may directly access the other component but unless explicitly described to the contrary, another component may be "connected" or "access" between the components.

In addition, each processes may be performed by hardware such as a processor, a micro processor, a micro controller, a central processing unit (CPU), a graphics processing unit (GPU), an accelerated Processing unit (APU), a digital signal processor (DSP), an application specific integrated circuit (ASIC), and a field programmable gate array (FPGA) or a combination of hardware and software in a system. Furthermore, the system may include a memory that stores data necessary for processing at least one function or operation.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

Hereinafter, example embodiments of the inventive concept will be described in detail.

FIG. 1 is a block diagram of an analog-to-digital converter according to an embodiment of the present invention.

Referring to FIG. 1, an analog-to-digital converter 100 according to an embodiment of the present invention may include an adder 110, a successive approximation register analog-to-digital converter (SAR ADC) 120, and a bandpass filter circuit 130.

The analog-to-digital converter 100 may receive an analog input signal AIN, convert the received analog input signal AIN into a digital output signal DOUT, and output the digital output signal DOUT.

The adder 110 may add the analog input signal AIN and a feedback signal AFB generated based on the analog input signal AIN and output an output signal as the result.

The output signal output by the adder 110 may be input to the SAR ADC 120 and the digital output signal DOUT quantized and output by the SAR ADC 120 may be output to the outside of the analog-to-digital converter.

According to an embodiment, the digital output signal DOUT may be a form in which digital data is sequentially output, and a framer (not shown) may be further included in a rear end of the SAR ADC 120 for serializing the digital output signal DOUT sequentially output to generate an N-bit data frame (N is a natural number).

The SAR ADC 120 receives the digital output signal DOUT and the analog input signal AIN and may output a differential signal ADF corresponding to a difference between the digital output signal DOUT and the analog input signal AIN.

The differential signal ADF output by the SAR ADC 120 may be input to the bandpass filter circuit 130.

The bandpass filter circuit 130 may perform bandpass filtering on the input differential signal ADF and may output the feedback signal AFB according to a result of the bandpass filtering.

The feedback signal AFB output by the bandpass filter circuit 130 may be input to the adder 110 and the adder 110 may correct an error occurring in a digital conversion process of the analog input signal AIN by adding the analog input signal AIN and the feedback signal AFB.

A detailed structure and operation of the SAR ADC 120 and the bandpass filter circuit 130 will be described later with reference to FIG. 2.

Figure 2:
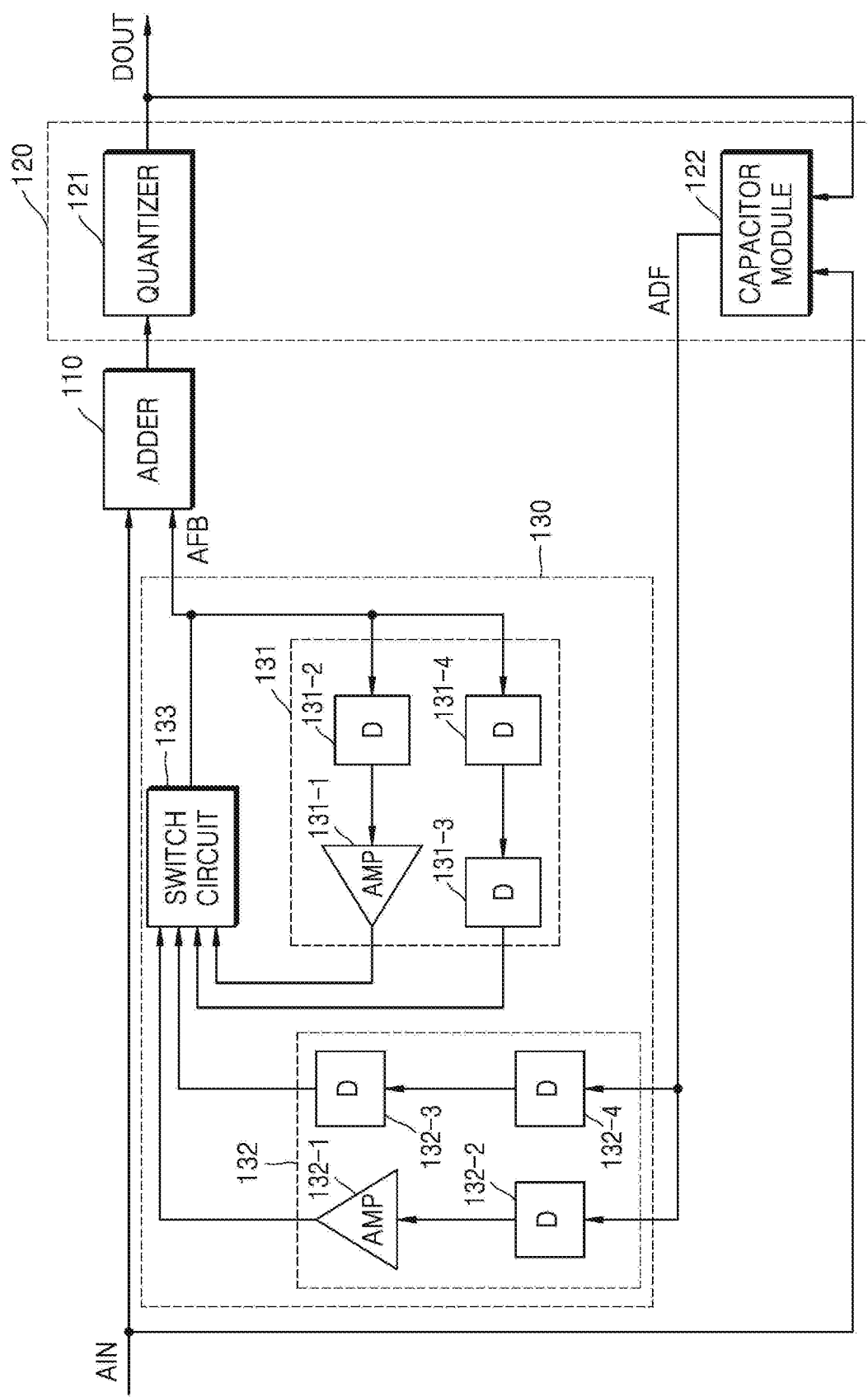
FIG. 2 is a view of a detailed configuration of the analog-to-digital converter shown in FIG. 1.

FIG. 2 is a view of a detailed configuration of the analog-to-digital converter shown in FIG. 1.

Referring to FIGS. 1 and 2, the SAR ADC 120 may include a quantizer 121 and a capacitor module 122.

The quantizer 121 may quantize an output signal of the adder 110 and output the digital output signal DOUT.

According to an embodiment, the adder 110 may be included in the quantizer 121.

The capacitor module 122 may be implemented in the form of including at least one capacitor that stores the digital output signal DOUT output from the quantizer 121.

The capacitor module 122 may store the analog input signal AIN and the digital output signal DOUT and may output the differential signal ADF corresponding to the difference between the analog input signal AIN and the digital output signal DOUT.

The bandpass filter circuit 130 may perform bandpass filtering on the differential signal ADF.

According to an embodiment, the bandpass filter circuit 130 may perform a noise shaping function on the analog input signal AIN by inputting the feedback signal AFB output by bandpass filtering the differential signal ADF to the adder 110.

According to an embodiment, the bandpass filter circuit 130 may have various types of transfer functions to pass signals of a desired band. For example, the bandpass filter circuit 130 may perform bandpass filtering according to a transfer function such as Formula 1 below.

$$\frac{-2\cos\theta \cdot Z^{-1} + Z^{-2}}{1 - 2\cos\theta \cdot Z^{-1} + Z^{-2}} \qquad \text{[Formula 1]}$$

The bandpass filter circuit 130 may include a first circuit portion 131, a second circuit portion 132, and a switch circuit 133.

The first circuit portion 131 may include first circuit components (e.g., 131-1 to 131-4) corresponding to a denominator of the transfer function of the bandpass filter circuit 130.

According to an embodiment, the first circuit components (e.g., 131-1 to 131-4) may include at least one of an amplifier (e.g., 131-1) and a delay (e.g., 131-2 to 131-4).

According to an embodiment, the first circuit components 131-1 to 131-4 may form signal paths that are separated from one another for each denominator term, which constitute the denominator of the bandpass filter circuit 130. For example, the first circuit components 131-1 and 131-2 constituting the second term (e.g., $-2 \cos \theta \cdot Z^{-1}$) of the denominator of Formula 1 above and the first circuit components 131-3 and 131-4 constituting the third term (e.g., $Z^{-2}$) of the denominator of Formula 1 above may form a separate signal path from each other.

The second circuit portion 132 may include second circuit components (e.g., 132-1 to 132-4) corresponding to a molecule of the transfer function of the bandpass filter circuit 130.

According to an embodiment, the second circuit components (e.g., 132-1 to 132-4) may include at least one of an amplifier (e.g., 132-1) and a delay (e.g., 132-2 to 132-4).

According to an embodiment, the second circuit components 132-1 to 132-4 may form signal paths that are separated from one another for each molecule term, which constitute the molecule of the bandpass filter circuit 130. For example, the second circuit components 132-1 and 132-2 constituting the first term (e.g., $-2 \cos \theta \cdot Z^{-1}$) of the molecule of Formula 1 above and the second circuit components 132-3 and 132-4 constituting the second term (e.g., $Z^{-2}$) of the molecule of Formula 1 above may form a separate signal path from each other.

According to an embodiment, the first circuit components (e.g., 131-1 to 131-4) of the first circuit portion 131 and the second circuit components (e.g., 132-1 to 132-4) of the second circuit portion 132 may form separate signal paths from each other.

The switch circuit 133 may switch output signals of the first circuit components (e.g., 131-1 to 131-4) of the first circuit portion 131 and the second circuit components (e.g., 132-1 to 132-4) of the second circuit portion 132 and output them as the feedback signal AFB.

According to an embodiment, the switch circuit 133 may add the output signals of the first circuit components (e.g., 131-1 to 131-4) of the first circuit portion 131 and the second circuit components (e.g., 132-1 to 132-4) of the second circuit portion 132 and output them as the feedback signal AFB.

According to an embodiment, the switch circuit 133 may be implemented with a multiplexer.

According to an embodiment, the switch circuit 133 may add signals input to four paths in a charge sharing manner. In this case, since magnitude of the signals input to the four paths of the switch circuit 133 is reduced to ¼, the first circuit component 131-1 and the second circuit component 132-1 may be configured to have a gain four times that of each term of the transfer function of the band-pass filter circuit 130. Accordingly, an amplifier having a gain of 4 may further be provided between the capacitor module 122 and the bandpass filter circuit 130.

According to an embodiment, the feedback signal AFB of the switch circuit 133 may be fed back and input to an input terminal of the first circuit portion 131.

The feedback signal AFB output from the switch circuit 133 may be input to the adder 110.

Figure 3:
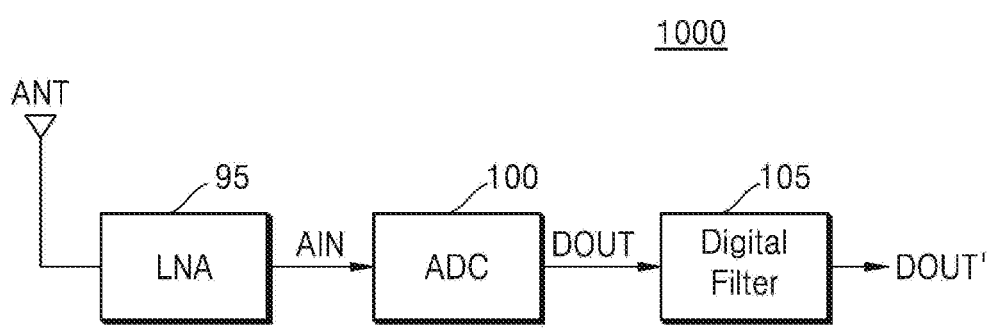
FIG. 3 is a view of a communication terminal including the analog-to-digital converter shown in FIG. 1.

FIG. 3 is a view of a communication terminal including the analog-to-digital converter shown in FIG. 1.

Referring to FIGS. 1 to 3, a communication terminal 1000 may include a low noise amplifier (LNA) 95, the analog-to-digital converter 100, and a digital filter 105.

According to an embodiment, the communication terminal 1000 may be implemented with various types of terminals capable of performing wireless communication.

The low noise amplifier 95 may generate the analog input signal AIN by low noise amplifying a communication signal (e.g., an RF signal) received via an antenna ANT of the communication terminal 1000.

The analog-to-digital converter 100 may receive the analog input signal AIN and may convert the received analog input signal AIN into the digital output signal DOUT and output the digital output signal DOUT.

The digital filter 105 may digital-filter only a signal of a desired frequency band from the digital output signal DOUT output by the analog-to-digital converter 100 and may output a filtered digital output signal DOUT'.

According to an embodiment, the communication terminal 1000 may further include a decimator (not shown) at a rear end of the analog-to-digital converter 100.

According to an embodiment, the communication terminal 1000 may perform noise shaping and digital conversion to the digital output signal DOUT through the analog-to-digital converter 100 according to an embodiment of the present invention without band shifting the analog input signal AIN. Accordingly, the communication terminal 100 including the analog-to-digital converter 100 according to an embodiment of the present invention may not include a mixer for band shifting the input signal AIN and a phase locked loop (PLL) for providing a clock signal to the mixer.

Apparatuses according to embodiments of the present invention may effectively convert a high frequency band signal into a digital signal by generating a feedback signal through bandpass filtering in a feedback path while facilitating operation of the feedback signal by applying a successive approximation register analog-to-digital converter (SAR ADC) to a structure capable of analog-to-digital conversion by adding an input signal and the feedback signal.

It should be understood that embodiments described herein should be considered in a descriptive sense only and not for purposes of limitation. Descriptions of features or aspects within each embodiment should typically be considered as available for other similar features or aspects in other embodiments.

While the present invention has been particularly shown and described with reference to embodiments thereof, it will be understood that various changes in form and details may be made therein without departing from the spirit and scope of the following claims.

What is claimed is:

1. An analog-to-digital converter comprising:
   an adder configured to add an input signal and a feedback signal generated based on the input signal and output an output signal as the result;
   a successive approximation register analog-to-digital converter (SAR ADC) configured to output a differential signal corresponding to a difference between a digital output signal obtained by quantizing the output signal output from the adder and the input signal; and a bandpass filter circuit configured to perform bandpass filtering on the differential signal output from the SAR ADC and to output the feedback signal according to a result of the bandpass filtering.

2. The analog-to-digital converter of claim 1, wherein the SAR ADC comprises a quantizer configured to quantize the output signal output from the adder and output the digital output signal.

3. The analog-to-digital converter of claim 2, wherein the SAR ADC comprises a capacitor module comprising at least one capacitor for storing the digital output signal output from the quantizer.

4. The analog-to-digital converter of claim 3, wherein the capacitor module is configured to output the differential signal corresponding to the difference between the digital output signal stored in the at least one capacitor and the input signal.

5. The analog-to-digital converter of claim 1, wherein the bandpass filter circuit is configured to form a signal path in which first circuit components corresponding to a denominator of a transfer function of the bandpass filter circuit and second circuit components corresponding to a molecule of the transfer function are separated from each other.

6. The analog-to-digital converter of claim 5, wherein the first circuit components are configured to form signal paths that are separated from one another for each denominator term of the transfer function.

7. The analog-to-digital converter of claim 5, wherein the second circuit components are configured to form signal paths that are separated from one another for each molecule term of the transfer function.

8. The analog-to-digital converter of claim 5, wherein the first circuit components and the second circuit components comprise at least one of an amplifier and a delay.

9. The analog-to-digital converter of claim 5, wherein the bandpass filter circuit further comprises:
a switch circuit for generating the feedback signal based on outputs of the first circuit components and the second circuit components.

10. The analog-to-digital converter of claim 9, wherein an output signal of the switch circuit is fed back and input to an input terminal of the signal path constituted by the first circuit components.

11. A communication terminal comprising:
an antenna configured to receive an RF signal; and
an analog-to-digital converter configured to analog-to-digital convert the received RF signal,
wherein the analog-to-digital converter comprises:
an adder configured to add an input signal and a feedback signal generated based on the input signal and output an output signal as the result;
a successive approximation register analog-to-digital converter (SAR ADC) configured to output a differential signal corresponding to a difference between a digital output signal obtained by quantizing the output signal output from the adder and the input signal; and
a bandpass filter circuit configured to perform bandpass filtering on the differential signal output from the SAR ADC and to output the feedback signal according to a result of the bandpass filtering.

12. The communication terminal of claim 11, wherein the communication terminal further comprises:
a low noise amplifier configured to low noise amplify the received RF signal and input the low noise amplified RF signal to the analog-to-digital converter.

13. The communication terminal of claim 12, wherein the communication terminal further comprises:
a digital filter configured to filter only a frequency band set in the digital output signal output from the analog-to-digital converter and to output the filtered signal.

* * * * *